(12) United States Patent  (10) Patent No.: US 7,619,571 B2
Vesterinen  (45) Date of Patent: Nov. 17, 2009

(54) ANTENNA COMPONENT AND ASSEMBLY

(75) Inventor: Jukka Vesterinen, Jyväskylä (FI)

(73) Assignee: Nokia Corporation, Espoo (FI)

( * ) Notice: Subject to any disclaimer, the term of this patent is extended or adjusted under 35 U.S.C. 154(b) by 372 days.

(21) Appl. No.: 11/478,457

(22) Filed: Jun. 28, 2006

(65) Prior Publication Data

US 2008/0001822 A1 Jan. 3, 2008

(51) Int. Cl.
H01Q 1/24 (2006.01)
(52) U.S. Cl. ..................................... 343/702
(58) Field of Classification Search ................. 343/702, 343/700 MS, 846–848, 872
See application file for complete search history.

(56) References Cited

U.S. PATENT DOCUMENTS 5,453,751 A * 9/1995 Tsukamoto et al. ... 343/700 MS
5,724,048 A * 3/1998 Remondiere ......... 343/700 MS
5,798,734 A * 8/1998 Ohtsuka et al. ....... 343/700 MS
7,123,208 B2 * 10/2006 Puente Baliarda et al. .. 343/800
7,170,451 B2 * 1/2007 Hsu ..................... 343/700 MS
7,183,980 B2 * 2/2007 Chang et al. .......... 343/700 MS
7,289,064 B2 * 10/2007 Cheng ................. 343/700 MS
2004/0108958 A1 6/2004 Sun ............................. 343/702
2006/0044191 A1 3/2006 Harihara ..................... 343/700
2007/0069959 A1 * 3/2007 Wu ..................... 343/700 MS

* cited by examiner

Primary Examiner—Huedung Mancuso
Assistant Examiner—Douglas Owens
(74) Attorney, Agent, or Firm—Ware, Fressola, Van Der Sluys & Adolphson, LLP

(57) ABSTRACT

A radio antenna is designed for use on a circuit board having a slot. The antenna is shaped such that one radiator segment is located in the slot while the other segment is located outside the slot. As such, the total thickness of the circuit board and the disposed antenna can be reduced. The antenna can be a chip antenna having a support block for disposing the radiator segments on opposite sides of the support block. The support block can have steps so that one or more different radiator segments can be disposed on the step surfaces, and the circuit board has a plurality of electrically conductive strips separately connected to the radiator segments on the step surfaces to provide grounding and feed to the antenna.

22 Claims, 5 Drawing Sheets

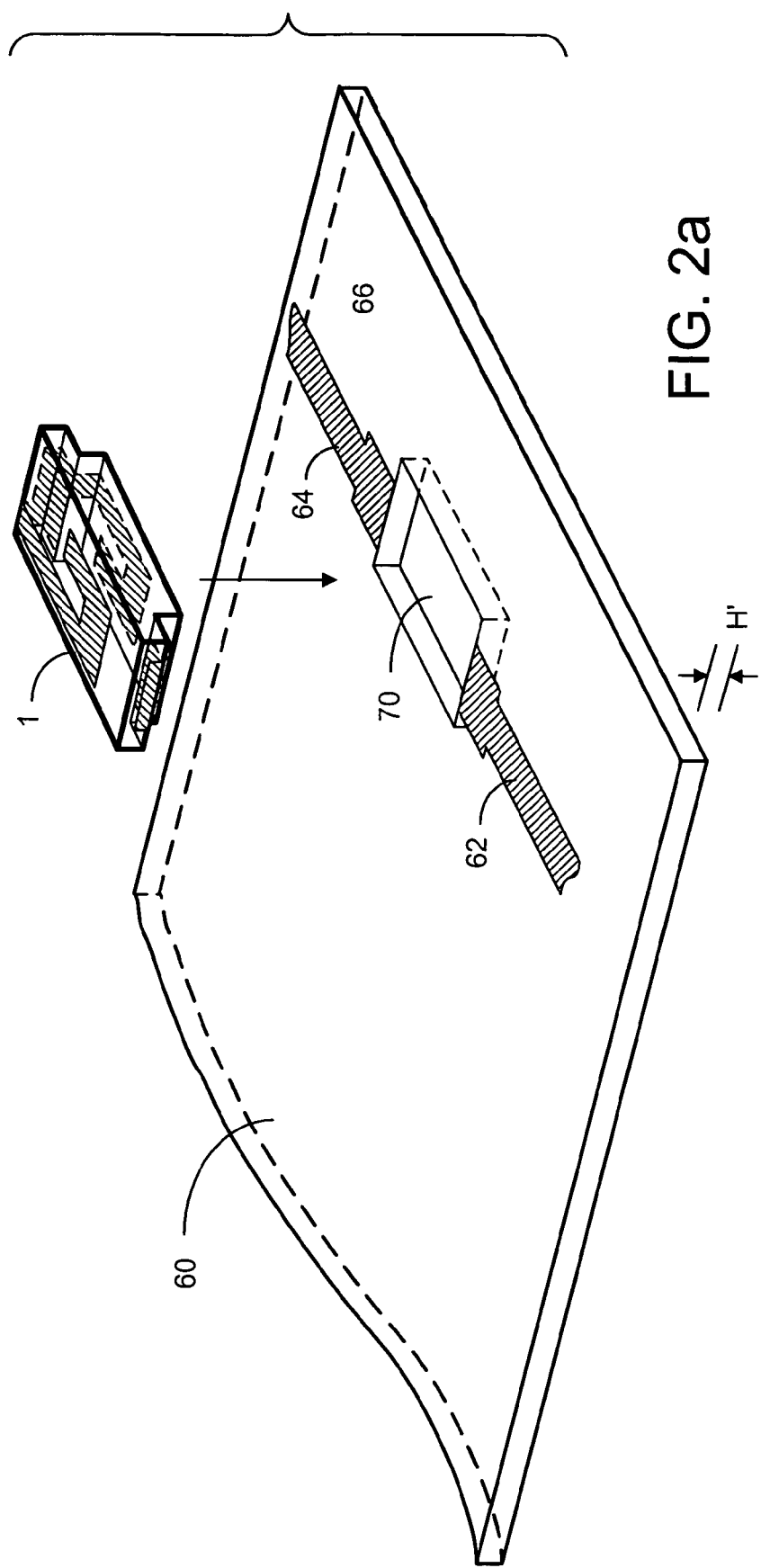

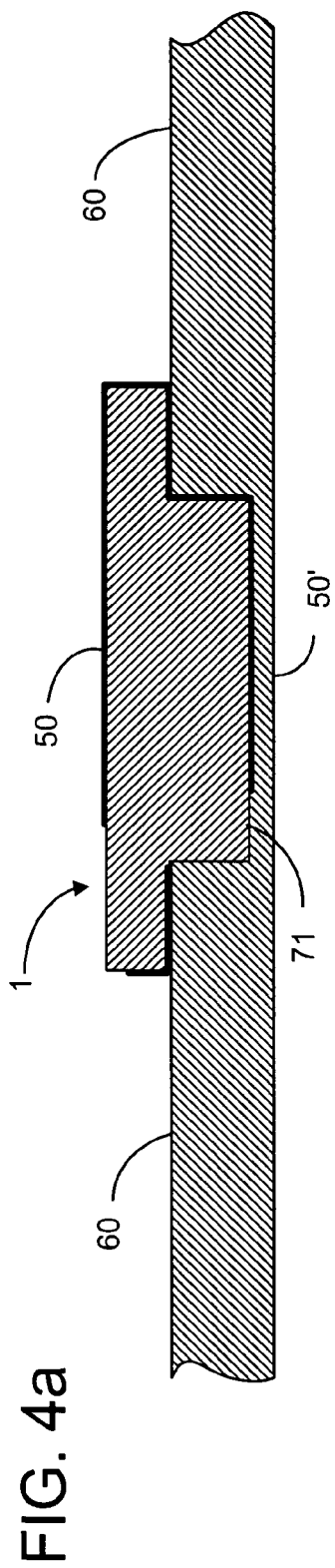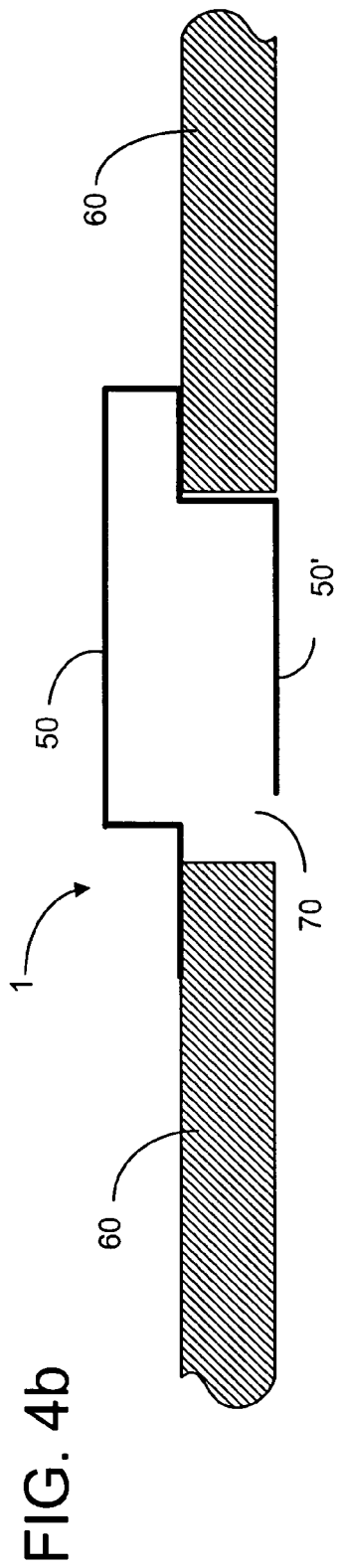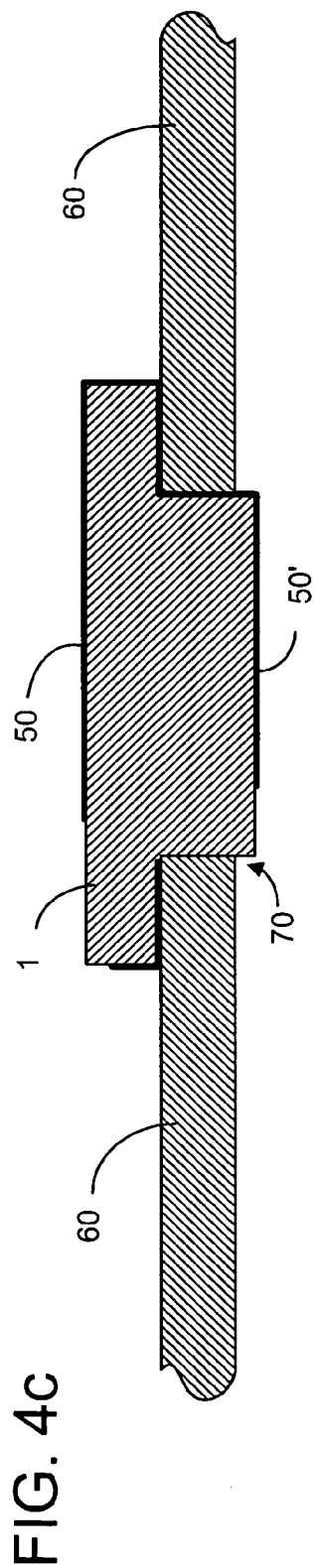

ANTENNA COMPONENT AND ASSEMBLY

FIELD OF THE INVENTION

The present invention generally relates to a radio antenna and, more particularly, to a chip antenna installed on a circuit board.

BACKGROUND OF THE INVENTION

As mobile phones become thinner and thinner, it is desirable to reduce the thickness of the phone components. The present invention provides a method to reduce the overall thickness of the circuit board having an antenna.

SUMMARY OF THE INVENTION

When a radio antenna is designed for use on a circuit board, the antenna is shaped such that a first radiator segment is substantially parallel to a second radiator segment and separated by a distance which is greater than the thickness of the circuit board. A slot or recess is made on the circuit board so that the second radiator segment is located in the slot or recess. As such, the total thickness of the circuit board and the antenna can be reduced. In particular, the antenna is a chip antenna having a support block for disposing the first and second radiator segments on opposite sides of the support block. The support block is dimensioned to fit the slot or recess. In one embodiment of the present invention, the support block has steps so that one or more different radiator segments can be disposed on the step surfaces, and the circuit board has a plurality of electrically conductive strips separately connected to the radiator segments on the step surfaces to provide grounding and feed to the antenna.

Thus, the first aspect of the present invention is a chip antenna that has electrically connected radiator segments located on opposite chip surfaces. The chip may have steps to dispose other radiator segments so that when the chip antenna is implemented on a circuit board having a slot, the radiator segments on the steps can be electrically connected to the electrically conductive strips on the circuit board for grounding and feeding purposes.

The second aspect of the present invention is a radio antenna assembly having an antenna disposed on a circuit board, wherein the antenna has a first radiator segment and a second radiator segment electrically connected to the first radiator segment, and the circuit board has a slot or recess such that the second radiator segment is located in the slot or recess whereas the first radiator segment is located outside the slot or recess. When the first and second radiator segments are substantially parallel to one another and separated by a distance greater than the thickness of the circuit board, placing the second radiator segment in the slot or recess reduces the total thickness of the antenna assembly. The antenna can be a chip antenna having a support block dimensioned to fit in the slot or recess.

The third aspect of the present invention is a method for implementing a radio antenna on a circuit board. The method comprises providing a slot or recess on the circuit board so as to allow part of the antenna to be located in the slot or recess.

The fourth aspect of the present invention is a communication device, such as a mobile phone, having a chip antenna that is partially located in a recess of a circuit board.

The present invention will become apparent upon reading the description taken in conjunction with FIGS. 1 to FIG. 4c.

BRIEF DESCRIPTION OF THE DRAWINGS

FIG. 2a is a schematic representation of a circuit board having a chip antenna, according to an embodiment of the present invention.

FIG. 2b is a cross sectional view of the circuit board of FIG. 2a.

FIG. 4a is a schematic representation of a circuit board, according to another embodiment of the present invention.

FIG. 4b is a schematic representation of a circuit board, according to a different embodiment of the present invention.

FIG. 4c is a schematic representation of a circuit board, according to yet another embodiment of the present invention.

DETAILED DESCRIPTION OF THE INVENTION

The present invention provides a method for reducing the overall thickness of a circuit board having an antenna disposed thereon. The circuit board can be a printed circuit board (PCB) or a printed wire board (PWB), for example. These boards usually have a considerable thickness. Thus, when a part or all of the board thickness can be eliminated at the location wherein the antenna is assembled, the overall thickness can be reduced.

Figure 1A:
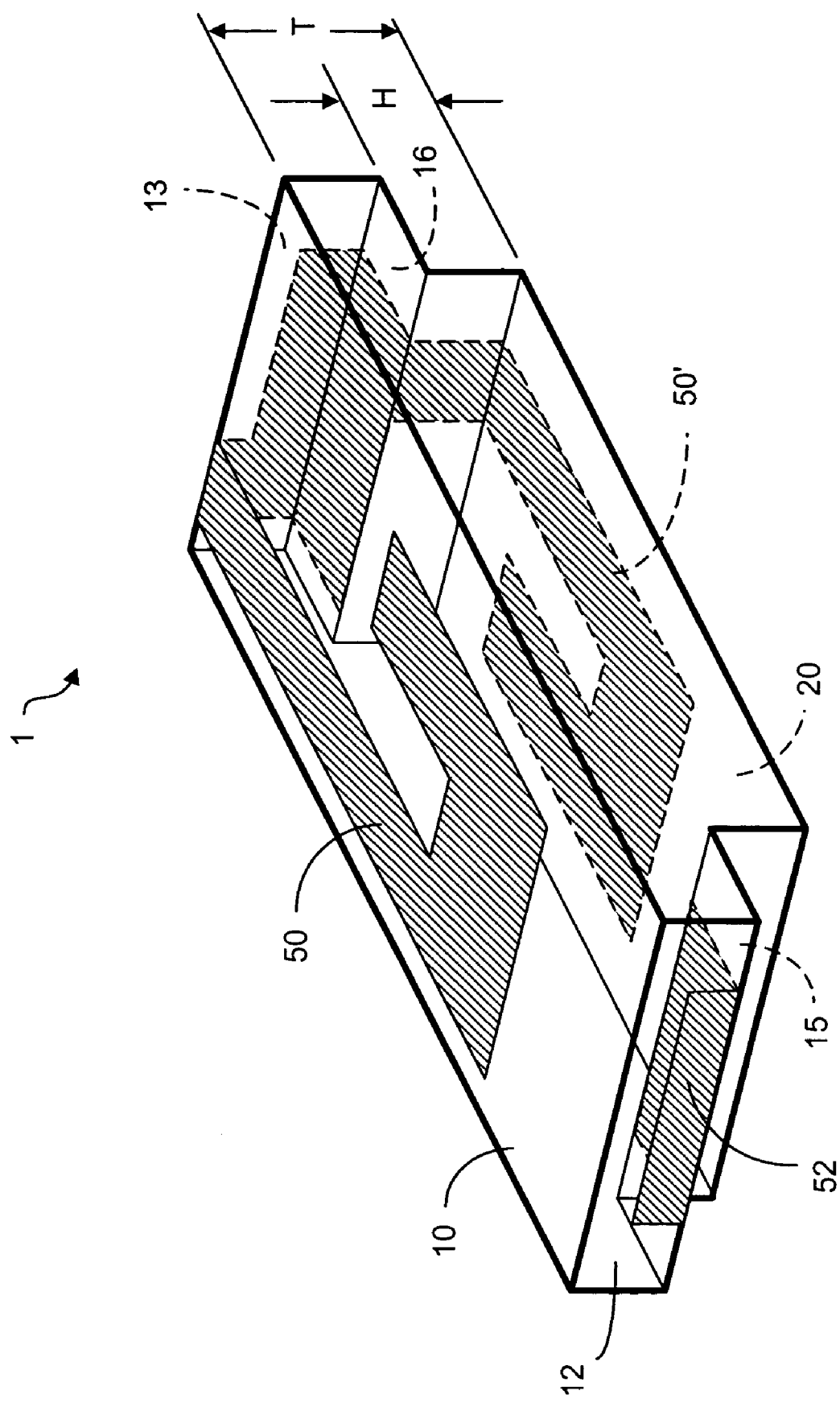
FIG. 1a is an example of a chip antenna, according to the present invention.

In one embodiment of the present invention, the antenna is disposed on a chip 1, as shown in FIG. 1a. As shown in FIG. 1, the chip itself has a thickness T. The chip has a step structure with the step height H. As such, the chip has a first surface 10 and an opposing second surface 20, separated from the first surface by the thickness T. In addition, there are two surfaces 15 and 16 substantially parallel to the first and second surfaces and located on two sides of the chip, and more surfaces such as side surfaces 12 and 13 which are perpendicular to the first and second surfaces.

The radiator of the antenna chip 1 is patterned such that an electrically conductive segment 50 is located on the first surface 10 and another electrically conductive segment 50' of the radiator is located on the second surface 20. These segments are electrically connected by connecting segments located on the step surface 16 and the side surface 13. The antenna chip 1 may also have a different electrically conductive segment 52. Part of the conductive segment 52 is located on the step surface 15.

It should be appreciated that the pattern as depicted in FIG. 1 is merely an example and the radiator can be patterned such that its electrically conductive segments are located on all or most of the chip surfaces.

Figure 1B:
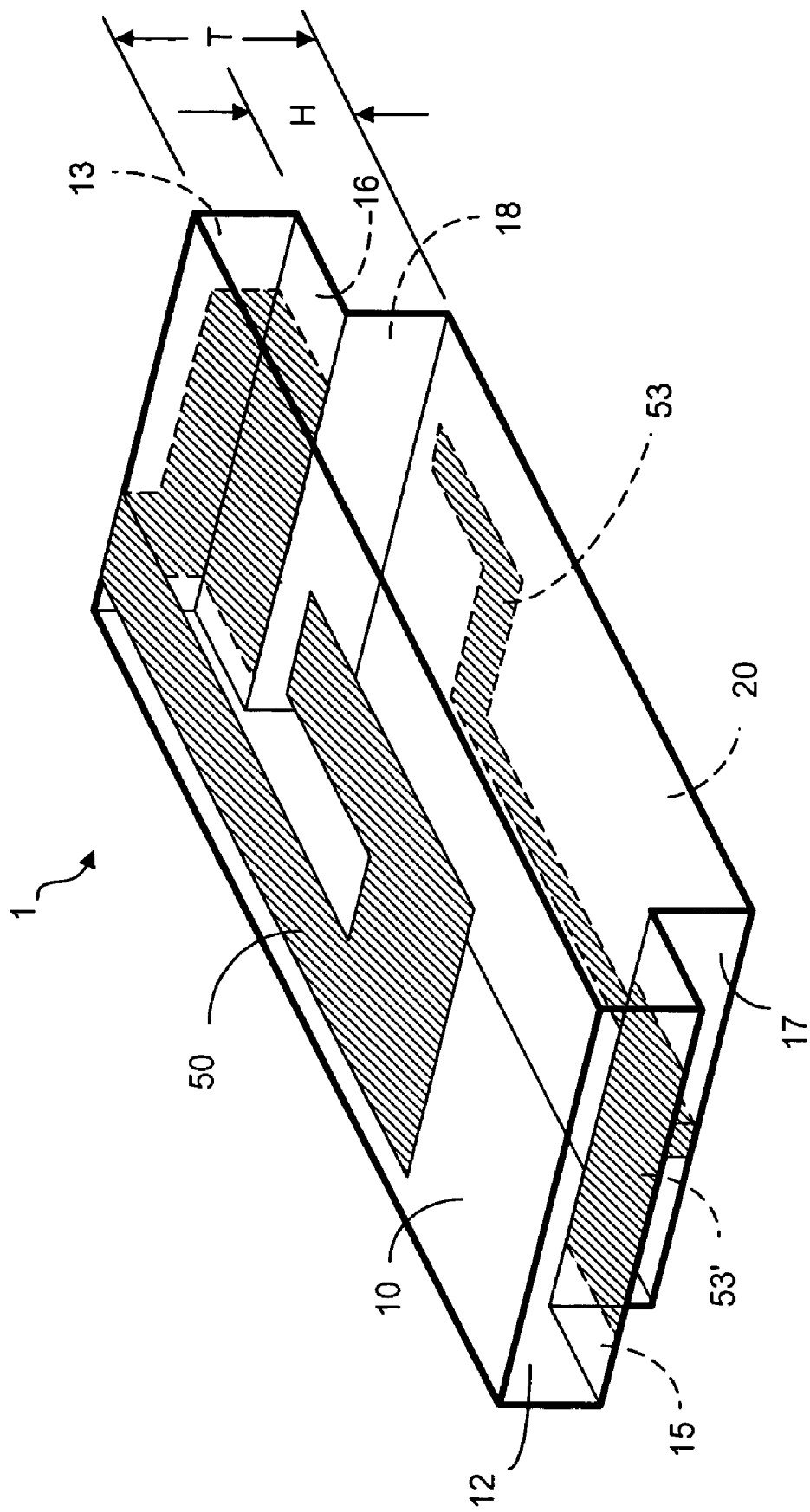
FIG. 1b is another example of the chip antenna.

FIG. 1b is another example of the chip antenna. As shown in FIG. 1b, the antenna chip 1 has a feed line 53 having a feed pad 53' locating on the step surface 15. In addition, the feed line 53 also has a conductive segment on the side surface 17. Likewise, the electrically conductive segment 50 is extended to side surface 13 and step surface 16.

Figure 2B:
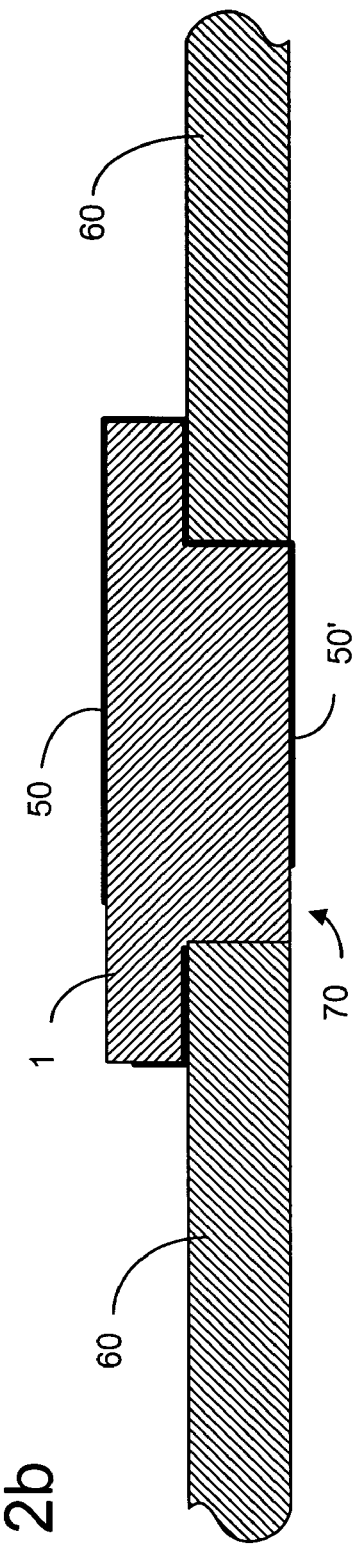

As shown in FIG. 2a, the antenna chip 1 is assembled onto a circuit board 60 having a thickness H'. As shown, the circuit board 60 has a slot 70 dimensioned to fit the bottom part of the antenna chip 1. The circuit board also has conductive strips 62 and 64. After assembled, the conductive strips 62 and 64 are electrically connected to the conductive segments located on the step surfaces 15 and 16 of the antenna chip 1. The conductive strips can be used as the feeding and ground lines of the antenna. As shown in FIG. 2b, the overall thickness of the assembled circuit board including the antenna chip is T+H'−H. Optimally, H=H' and the overall thickness is the thickness T of the antenna chip 1. However, H can be smaller or greater than H'.

Without the slot 70, the overall thickness would be T+H'. Thus, with H=H', the reduction of the overall thickness is H'/(T+H').

Figure 3:
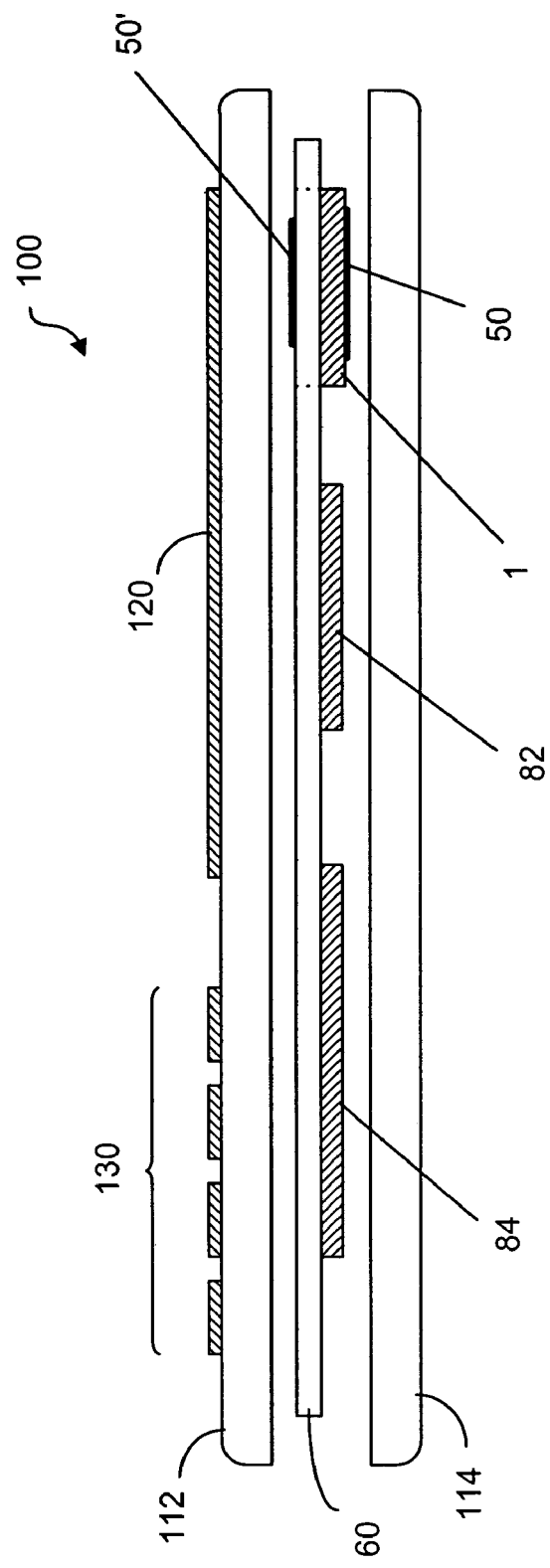
FIG. 3 is a schematic representation of a mobile phone having a chip antenna and a circuit board, according to an embodiment of the present invention.

FIG. 3 is a schematic representation of a mobile phone 100 having an assembled circuit board, according to an embodiment of the present invention. As shown, the mobile phone 100 has an upper housing part 112 and a lower housing part 114 to house the circuit board 60. The upper housing part 112 may have a keypad 130 and a display 120. The circuit board 60 may have one or more electronic components such as signal processor and display driver 82 and 84 disposed thereon. The circuit board 60 also has a ground plane (not shown).

It should be noted that the recess on the circuit board 60 to accommodate the chip 1 is not necessarily a slot 70 as shown in FIGS. 2a and 2b. The recess can be made differently. For example, the depth of the recess 71 is smaller than the thickness of the circuit board 60.

The antenna chip 1 can be a ceramic chip antenna. However, the support block of the antenna chip 1 can be made from ferrite, plastic or other dielectric materials. Furthermore, the same principle is also applicable to antennas made from conductive wires or planar strips without a support block. Part of the wire or strip antenna can be located within the slot 70 of the circuit board 60, as shown in FIG. 4b. Moreover, the radiator part 50' can be located below the bottom of the circuit board 60, jutting out of the slot 70, as shown in FIG. 4c.

The example antenna chips 1a and 1b are basic dual-band monopole type antenna concepts. It would be understood by those skilled in the art that the exact type of antenna concept and therefore it's metallization could be changed on any or all of the surfaces of this support block to give at least one of, and not limited to, the following antenna concepts: Helix (helical antenna), PIFA (Planar Inverted-F Antenna), IFA (Inverted-F Antenna), PILA (Planar Inverted-L Antenna), Patch antenna, Slot Antenna, and other known antenna design concepts. Furthermore, the shape of the support block can be made differently. For example, not only steps are made on the bottom side of the block, steps can also be made on the top side of the block to shape the radiator segment 50.

In addition to the antenna concept type, the present invention can be used to deliver thin antenna solutions for any or all of the following known protocols, for example, GSM, E-GSM, CDMA, PDC, WCDMA, BLUETOOTH, WLAN, HLAN, GPS, WiMax, UWB, FM, RFID, DVB-H, DRM, DAB, AM and other Cellular and Non-Cellular radio systems. It should be appreciated that the above list is by no means fully comprehensive, and is for illustrative purposes only, as the present invention can be applied to other radio bands as well.

In sum, the present invention provides an antenna component to be disposed on a circuit board having a recess or a slot. The antenna component comprises a radiating element for receiving or transmitting electromagnetic waves indicative of radio communication signals. The radiating element has a plurality of conductive segments. At least one of the segments is located within the recess or slot. The antenna component may have a different conductive segment for feeding the radiating element and another conductive segment for grounding the radiating element. The antenna component may have means for supporting the conductive segments. The support means may be a ceramic block, a plastic block or the like. Preferably, the block has a step like structure so that part of the antenna component can be dropped into the recess or slot. The present invention also provides a method to reduce the total thickness of the circuit board by disposing a radio antenna component on a circuit board having a recess or slot and by shaping the radiating element of the antenna component such that part of the radiating element is located in the recess or slot and part of the radiating element is located outside the recess or slot.

Thus, although the present invention has been described with respect to one or more embodiments thereof, it will be understood by those skilled in the art that the foregoing and various other changes, omissions and deviations in the form and detail thereof may be made without departing from the scope of this invention.

What is claimed is:

1. A radio antenna, comprising:

a radiating element arranged on a circuit board having a recess; and a feed point electrically coupled to the radiating element, wherein at least part of the radiating element is located in the recess, and a support block having a plurality of surfaces, wherein the radiating element comprises a plurality of conductive segments disposed on two or more of said plurality of surfaces, wherein the circuit board has a first board surface and an opposing second board surface defining a board thickness, and the support block comprises a first block surface and an opposing second block surface dimensional to be located in the recess, the support block further comprising at least one step surface located on a plane between the first and second block surfaces, such that when the second block surface is located in the recess, said at least one step surface can be made to contact to the first board surface.

2. The radio antenna of claim 1, wherein at least one of the conductive segments is located on said at least one step surface so as to make electrical contact to the circuit board.

3. The radio antenna of claim 1, wherein the support block is made of ceramic.

4. The radio antenna of claim 1, wherein the support block is made of plastic.

5. A radio antenna assembly comprising:

a circuit board having a recess; and a radio antenna component comprising a radiating element disposed on the circuit board, wherein at least part of the radiating element is located in the recess, wherein the circuit board has a first surface and an opposing second surface defining a board thickness, and the recess comprises a slot made through the board thickness, and wherein the radiating element comprises a first segment located in the slot and a second segment located outside the slot.

6. The radio antenna assembly of claim 5, wherein the circuit board comprises at least one electrically conductive strip disposed on the first surface, and the radiating element comprises a different segment electrically connected to the electrically conductive strip.

7. The radio antenna assembly of claim 6, wherein the electrically conductive strip is used for grounding the radiating element.

8. The radio antenna assembly of claim 7, further comprising a feeding point electrically coupled to the radiating element, wherein the circuit board further comprises a different electrically conductive strip disposed on the first surface electrically coupled to a feeding point.

9. The radio antenna assembly of claim 5, further comprising a support block having a plurality of block surfaces, wherein the radiating element has a plurality of conductive segments located on two or more of the block surfaces.

10. The radio antenna assembly of claim 9, wherein the support block and the radiating element are integrated in a chip antenna.

11. The radio antenna assembly of claim 9, wherein
the circuit board has a first board surface and an opposing second board surface defining a board thickness,
the support block comprises a first block surface and an opposing second block surface dimensional to be located in the recess, the support block further comprising at least one step surface located on a plane between the first and second block surfaces, such that when the second block surface is located in the recess, said at least one step surface can be made to contact to the first board surface.

12. The radio antenna assembly of claim 11, wherein at least one of the conductive segments is located on said at least one step surface, and the circuit board has at least one electrically conductive strip on the first surface electrically connected to said at least one of the conductive segments.

13. The radio antenna assembly of claim 9, wherein the circuit board has a first surface and an opposing second surface defining a board thickness, and the recess comprises a slot made through the board thickness, and wherein the conductive segments comprise a first segment located in the slot and a second segment spaced from the first segment with a distance greater than the board thickness.

14. A radio antenna assembly comprising:
a circuit board having a recess; and
a radio antenna component comprising a radiating element disposed on the circuit board, wherein at least part of the radiating element is located in the recess, wherein the circuit board has a first surface and an opposing second surface defining a board thickness, and the recess comprises a slot made through the board thickness, and wherein the radiating element comprises a plurality of conductive segments and at least one of the conductive segments is located in the slot.

15. The radio antenna assembly of claim 14, wherein the conductive segments comprise a first segment located in the slot and a second segment spaced from the first segment, and the first and second segments are arranged such that the first segment is located between the first surface and the second surface, and the second surface is located between the first segment and the second segment.

16. The radio antenna assembly of claim 14, wherein the conductive segments comprise a first segment located in the slot substantially co-planar with the first surface, and a second segment spaced from the first segment, such that the second surface is located between the first segment and the second segment.

17. The radio antenna assembly of claim 14, wherein the conductive segments comprise a first segment and a second segment spaced from the first segment, and the first and second segments are arranged such that the first surface is located between the first segment and the second surface, and the second surface is located between the first surface and the second segment.

18. A method comprising:
arranging a radio antenna component on a circuit board having a recess, the radio antenna component comprising a radiating element;
shaping the radiating element such that part of the radiating element is located in the recess and part of the radiating element is located outside the recess, wherein the circuit board has a first surface and an opposing second surface defining a board thickness, and the recess comprises a slot made through the board thickness, and wherein the radiating element having a plurality of conductive segments and at least one of the conductive segments is located in the slot.

19. The method of claim 18, wherein the radiating element having a plurality of conductive segments, said method further comprising
providing a support block having a plurality of surfaces for disposing the plurality of conductive segments, wherein at least one of the surfaces is dimensioned to be located in the recess so that at least one of the conductive segments can be disposed in the recess.

20. A communication device comprising:
a housing;
a circuit board disposed in the housing, the circuit board having a recess; and
a radio antenna component disposed on the circuit board, wherein the radio antenna component is at least partially located in the recess, wherein the radio antenna component comprises a first radiator segment and a second radiator segment electrically connected to the first radiator segment, and wherein the first radiator segment is located outside the recess and the second radiator segment is located in the recess.

21. A communication device comprising:
a housing;
a circuit board disposed in the housing, the circuit board having a recess; and
a radio antenna component disposed on the circuit board, wherein the radio antenna component is at least partially located in the recess, wherein the circuit board has a first surface and an opposing second surface defining a board thickness, and the recess comprises a slot made through the board thickness, wherein the radio antenna component comprises a first radiator segment and a second radiator segment electrically connected to the first radiator segment, and the first radiator segment located outside the recess adjacent to the first surface and second radiator segment is located outside the recess adjacent to the second surface.

22. A communication device comprising:
a housing;
a circuit board disposed in the housing, the circuit board having a recess; and
a radio antenna component disposed on the circuit board, wherein the radio antenna component is at least partially located in the recess, wherein the circuit board has a first surface and an opposing second surface defining a board thickness, and the recess comprises a slot made through the board thickness, and wherein the first radiator segment is spaced from the second radiator segment by a distance greater than the board thickness.

* * * * *

UNITED STATES PATENT AND TRADEMARK OFFICE
CERTIFICATE OF CORRECTION

PATENT NO. : 7,619,571 B2
APPLICATION NO. : 11/478457
DATED : November 17, 2009
INVENTOR(S) : Jukka Vesterinen It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 514 days.

Signed and Sealed this

Twenty-sixth Day of October, 2010

David J. Kappos
*Director of the United States Patent and Trademark Office*